United States Patent
Yamaguchi et al.

(10) Patent No.: US 9,603,295 B2
(45) Date of Patent: Mar. 21, 2017

(54) MOUNTED STRUCTURE AND MANUFACTURING METHOD OF MOUNTED STRUCTURE

(75) Inventors: Atsushi Yamaguchi, Osaka (JP); Hisahiko Yoshida, Osaka (JP); Arata Kishi, Nara (JP); Naomichi Ohashi, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 277 days.

(21) Appl. No.: 14/007,808

(22) PCT Filed: Apr. 2, 2012

(86) PCT No.: PCT/JP2012/002255
§ 371 (c)(1),
(2), (4) Date: Sep. 26, 2013

(87) PCT Pub. No.: WO2012/137457
PCT Pub. Date: Oct. 11, 2012

(65) Prior Publication Data
US 2014/0049930 A1 Feb. 20, 2014

(30) Foreign Application Priority Data
Apr. 4, 2011 (JP) .................. 2011-082555

(51) Int. Cl.
*H05K 7/00* (2006.01)
*H05K 13/04* (2006.01)
(Continued)

(52) U.S. Cl.
CPC ......... *H05K 13/0465* (2013.01); *H01L 24/16* (2013.01); *H01L 24/81* (2013.01);
(Continued)

(58) Field of Classification Search
CPC ....... H01L 2924/00; H01L 2224/16225; H01L 2924/00012; H01L 2224/13111;
(Continued)

(56) References Cited

U.S. PATENT DOCUMENTS

| 5,520,752 A | 5/1996 | Lucey et al. |
| 6,274,389 B1 | 8/2001 | Iida |

(Continued)

FOREIGN PATENT DOCUMENTS

| CN | 101965632 | 2/2000 |
| CN | 1237595 | 1/2006 |

(Continued)

OTHER PUBLICATIONS

International Search Report for PCT/JP2012/002255, May 29, 2012.
(Continued)

*Primary Examiner* — Yuriy Semenenko
(74) *Attorney, Agent, or Firm* — RatnerPrestia

(57) ABSTRACT

In a case where a first mounted substrate to which a semiconductor element is bounded by solder is mounted on a second substrate, connection strength becomes low, when the first mounted substrate is bonded to the second substrate by using a solder having a low melting point. A mounted structure, in which a first mounted substrate on which a semiconductor element is bonded by using a first solder having a melting point of 217° C. or more, is mounted on a second substrate, includes plural bonding parts bonding the first mounted substrate to the second substrate; and a reinforcing member formed around the bonding part. Each of the bonding parts contains a second solder having a melting point, that is lower than the melting point of the first solder, and a space exists, in which the reinforcing members do not exist, between the bonding parts neighboring each other.

13 Claims, 6 Drawing Sheets

(51) Int. Cl.
*H01L 23/00* (2006.01)
*H05K 3/34* (2006.01)
*H05K 1/18* (2006.01)
*H05K 1/14* (2006.01)

(52) U.S. Cl.
CPC .......... *H05K 1/181* (2013.01); *H05K 3/3436* (2013.01); *H01L 24/13* (2013.01); *H01L 2224/10126* (2013.01); *H01L 2224/13111* (2013.01); *H01L 2224/16058* (2013.01); *H01L 2224/16225* (2013.01); *H01L 2224/16227* (2013.01); *H01L 2224/32225* (2013.01); *H01L 2224/73204* (2013.01); *H01L 2224/8149* (2013.01); *H01L 2224/8159* (2013.01); *H01L 2224/81192* (2013.01); *H01L 2224/81193* (2013.01); *H01L 2224/81411* (2013.01); *H01L 2224/81413* (2013.01); *H01L 2224/81613* (2013.01); *H01L 2224/81815* (2013.01); *H01L 2224/81862* (2013.01); *H01L 2224/81885* (2013.01); *H01L 2924/014* (2013.01); *H01L 2924/0105* (2013.01); *H01L 2924/01006* (2013.01); *H01L 2924/01029* (2013.01); *H01L 2924/01049* (2013.01); *H01L 2924/01322* (2013.01); *H01L 2924/15311* (2013.01); *H01L 2924/15788* (2013.01); *H01L 2924/19105* (2013.01); *H01L 2924/20106* (2013.01); *H01L 2924/351* (2013.01); *H05K 1/141* (2013.01); *H05K 3/3463* (2013.01); *H05K 2201/10977* (2013.01); *H05K 2203/047* (2013.01); *Y02P 70/613* (2015.11)

(58) Field of Classification Search
CPC . H01L 2224/32225; H01L 2224/73204; H01L 2924/01049; H01L 2924/0105; H01L 2924/0665; H01L 2224/81413; H01L 2224/8149
USPC .......... 361/760, 764, 783, 767; 174/255–261
See application file for complete search history.

(56) References Cited

U.S. PATENT DOCUMENTS

| | | | |
|---|---|---|---|
| 2002/0033525 A1* | 3/2002 | Ohuchi | 257/679 |
| 2003/0027942 A1* | 2/2003 | Oota et al. | 525/461 |
| 2003/0067313 A1 | 4/2003 | Toyoshima et al. | |
| 2004/0046252 A1* | 3/2004 | Fujimori | H01L 21/563 257/734 |
| 2006/0065962 A1* | 3/2006 | Narendra et al. | 257/686 |
| 2007/0145575 A1 | 6/2007 | Mori et al. | |
| 2008/0185716 A1* | 8/2008 | Huang | 257/737 |
| 2009/0233117 A1 | 9/2009 | Sakai et al. | |
| 2011/0095423 A1 | 4/2011 | Ohashi | |

FOREIGN PATENT DOCUMENTS

| | | | |
|---|---|---|---|
| CN | 1243601 | | 2/2011 |
| JP | 6-268365 | A | 9/1994 |
| JP | 3027441 | B2 | 1/2000 |
| JP | 2000141079 | * | 5/2000 |
| JP | 2001-35966 | A | 2/2001 |
| JP | 2002-176248 | A | 6/2002 |
| JP | 2002-334903 | A | 11/2002 |
| JP | 2003-59970 | A | 2/2003 |
| JP | 2002-176248 | A | 4/2004 |
| JP | 2004-274000 | A | 9/2004 |
| JP | 2005-64303 | A | 3/2005 |
| JP | 2005-235819 | A | 9/2005 |
| JP | 2007-134476 | A | 5/2007 |
| JP | 4135268 | B2 | 6/2008 |
| JP | 2009-99963 | A | 5/2009 |
| JP | 2009-155431 | A | 7/2009 |
| JP | 2011-18741 | A | 1/2011 |
| WO | 9832159 | | 7/1998 |

OTHER PUBLICATIONS

Chinese Office Action mailed Oct. 8, 2015 for Chinese Application No. 201280015787.8 with translation.

Chinese Office Action and Search Report with partial English language translation for Application No. 201280015787.8, dated Sep. 20, 2016, 12 pages.

* cited by examiner

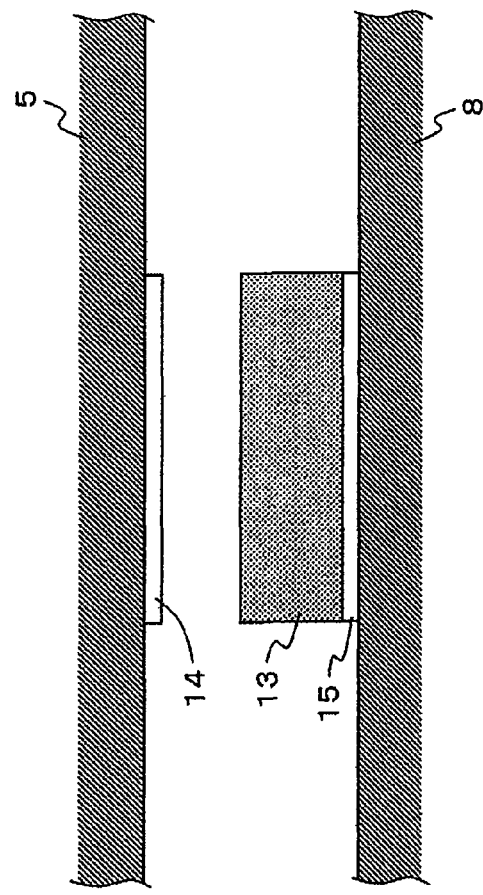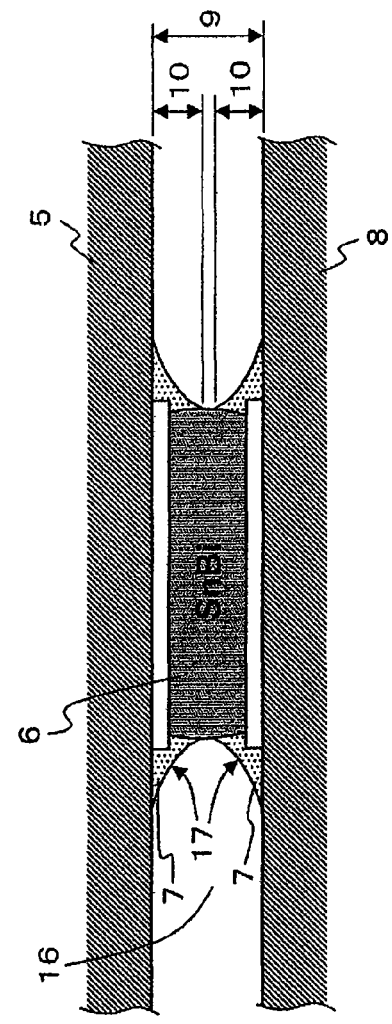
FIG. 4(a)
FIG. 4(b)

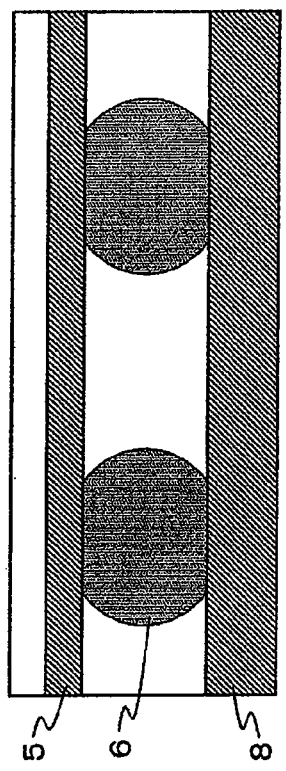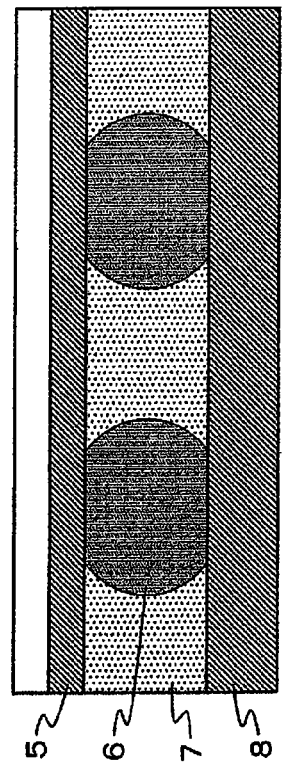

MOUNTED STRUCTURE AND MANUFACTURING METHOD OF MOUNTED STRUCTURE

This application is a U.S. National Phase Application of PCT International Patent Application No. PCT/JP2012/002255, filed Apr. 2, 2012, claiming the benefit of priority of Japanese Patent Application No. 2011-082555, filed Apr. 4, 2011, all of which are incorporated by reference herein in their entirety.

FIELD OF THE INVENTION

The present invention relates to a mounted structure of an electronic circuit board and a manufacturing method of the same. The present invention relates to a mounted structure of an electronic part, a semiconductor chip and the like on a substrate.

BACKGROUND OF THE INVENTION

Nowadays, as solder materials for mounting the electronic parts on the substrate, solder material of Sn—Ag system, particularly 96.5Sn-3Ag-0.5Cu (that has composition of Sn96.5 wt %, Ag3 wt % and Cu0.5 wt %) is mainly used (for example, see Japanese Patent No. 3027441 and U.S. Pat. No. 5,520,752).

FIG. 6 is a sectional view illustrating constitution of a bonding structure of the electronic circuit board using conventional solder materials.

In a case of FIG. 6, a semiconductor element 24 such as a BGA (Ball Grid Array) package or an LGA (Land Grid Array) package, and an electronic part 22 are bonded to a first mounted substrate 25 by solder 21. The semiconductor element 24 such as a BGA package or an LGA package, as shown in FIG. 6, has a sealing structure which is sealed by sealing material 23 for reinforcing, because a crack is prone to occur in a temperature cyclic ageing test or a drop test when a bonding part becomes fine.

However, in a case where the sealed first mounted substrate 25 is mounted on a second substrate 27 by using the solder of 96.5Sn-3Ag-0.5Cu, the conventional structure has a problem of causing poor connection due to melting of the solder 21 on the first mounted substrate 25. Further, reference numeral 26 denotes the bonding part which is soldered by the solder of 96.5Sn-3Ag-0.5Cu.

Therefore, a need is increasing for reducing a bonding temperature when the first mounted substrate is mounted on the second substrate 27.

Accordingly, for the purpose of preventing the solder 21 on the first mounted substrate 25 from melting by lowering the bonding temperature at which the first mounted substrate 25 is mounted on the second substrate 27, Sn—Bi system solder having a low temperature melting point, which is lower than the melting point of the solder 21 used on the first mounted substrate 25, attracts attention as a bonding material for mounting the first mounted substrate 25 on the second substrate 27 (for example, see Japanese Patent No. 4135268).

SUMMARY OF THE INVENTION

Problems to be Solved by the Invention

However, as described above, when the first mounted substrate 25 is mounted on the second substrate 27 by using the solder of Sn—Bi system, there is a problem that the connection strength is lower as compared with the solder of Sn—Ag system.

For example, in a case where an electrode surface of the first mounted substrate 25 bonded to the second substrate 27 is a BGA type, when the bonding is performed by using the solder of Sn—Bi system, an interval between the first mounted substrate 25 and the bonding part 26 has a high connection strength because of the bonding with solder balls of Sn—Ag system, however, the connection strength of an interval between the second substrate 27 and the bonding part 26 becomes low because of the bonding with the solder of Sn—Bi system which is firmer and more fragile than the solder of Sn—Ag system.

Further, for example, in a case where an electrode surface of the first mounted substrate 25 bonded to the second substrate 27 is an LGA type, connection strength of an interval between the bonding part 26 and the first mounted substrate 25 and connection strength of an interval between the bonding part 26 and the second substrate 27 both become low, because the interval between the first mounted substrate 25 and the bonding part 26 and the interval between the second substrate 27 and the bonding part 26 are both bonded by the solder of Sn—Bi system.

Therefore, under the present conditions the practical use of the bonding with the solder of Sn—Ag system does not readily advance.

An aspect of the present invention is, in view of the above-mentioned conventional problems, to furnish a mounted structure and a manufacturing method of the same which have good dropping characteristic, good temperature cycling characteristic and higher reliability than the conventional type, on the constitution in which the first mounted substrate, to which the semiconductor element has been bonded and mounted with the solder, has been mounted on the second substrate.

SUMMARY OF THE INVENTION

To solve the above problems, the $1^{st}$ aspect of the present invention is a mounted structure, in which a first mounted substrate to which a semiconductor element is bonded by using a first solder having a melting point of 217° C. or more, is mounted on a second substrate, comprising:

a plurality of bonding parts bonding the first mounted substrate to the second substrate; and a reinforcing member formed around the bonding part, wherein each of the bonding parts contains a second solder having a melting point, that is lower than the melting point of the first solder, as a solder material, and a space exists, in which the reinforcing members do not exist, between the bonding parts which are neighboring each other.

The $2^{nd}$ aspect of the present invention is the mounted structure according to the $1^{st}$ aspect of the present invention, wherein when a volume between the first mounted substrate and the second substrate, is denoted as V0, a sum total volume of each bonding part which is formed between the first mounted substrate and the second substrate, is denoted as V1, and a sum total volume of each reinforcing member which is formed between the first mounted substrate and the second substrate, is denoted as V2, a following formula is established:

$$V0-V1-V2>0.$$

The 3rd aspect of the present invention is the mounted structure according to the 1st aspect of the present invention, wherein the reinforcing member is in contact with the second substrate, a height of the reinforcing member formed around the bonding part is 1/5 or more of a distance between the substrates with reference to a surface of the second substrate.

The 4th aspect of the present invention is the mounted structure according to the 1st aspect of the present invention, wherein the second solder contains at least Sn and has a melting point of 200° C. or less.

The 5th aspect of the present invention is the mounted structure according to the 4th aspect of the present invention, wherein composition of the second solder contains either metal of Bi of 50 to 70 wt % or In of 10 to 25 wt %, and residue is Sn.

The 6th aspect of the present invention is the mounted structure according to the 1st aspect of the present invention, wherein the reinforcing member contains liquid bisphenol F type epoxy resin and imidazole system curing agent.

The 7th aspect of the present invention is the mounted structure according to the 1st aspect of the present invention, wherein the first mounted substrate is thinner than the second substrate.

The 8th aspect of the present invention is the mounted structure according to the 1st aspect of the present invention, wherein the first mounted substrate is a BGA type in which bumps are formed on a surface of the first mounted substrate, that faces the second substrate, by using solder balls.

The 9th aspect of the present invention is the mounted structure according to the 1st aspect of the present invention, wherein the first mounted substrate is an LGA type in which plane electrode pads are formed on a surface of the first mounted substrate, that faces the second substrate, and the reinforcing member is in contact with the first mounted substrate and the second substrate.

The 10th aspect of the present invention is a manufacturing method of a mounted structure, in which a first mounted substrate, to which a semiconductor element has been bonded by using a first solder having a melting point of 217° C. or more, is mounted on a second substrate, comprising:

supplying a compound material, which has been obtained by mixing a reinforcing resin and a second solder having a melting point that is lower than the melting point of the first solder, on a plurality of places on the second substrate;

disposing the first mounted substrate on the second substrate on which the compound material has been supplied; and heating the compound material at a temperature that is lower than a melting point of the first solder and higher than a melting point of the second solder, and bonding the first mounted substrate and the second substrate.

The 11th aspect of the present invention is the manufacturing method of the mounted structure according to the 10th aspect of the present invention, wherein the first mounted substrate is a BGA type in which bumps have been formed on a surface of the first mounted substrate, that faces the second substrate, by using solder balls, in the case of bonding the first mounted substrate and the second substrate, bonding parts bonding the first mounted substrate and the second substrate, which are formed by the bump and the second solder, are formed on a plurality of places, and a reinforcing member, which reinforces the bonding part, is formed in contact with the second substrate, by the reinforcing resin gathering around the bonding part.

The 12th aspect of the present invention is the manufacturing method of the mounted structure according to the 10th aspect of the present invention, wherein the first mounted substrate is an LGA type in which plane electrode pads have been formed on a surface of the first mounted substrate, that faces the second substrate, in the case of bonding the first mounted substrate and the second substrate, bonding parts bonding the first mounted substrate and the second substrate, which are formed by the second solder, are formed on a plurality of places, and a reinforcing member, which reinforces the bonding part, is formed in contact with the first mounted substrate and the second substrate, by the reinforcing resin gathering around the bonding part.

Advantageous Effects of the Invention

According to an aspect of the present invention, it is possible to furnish a mounted structure and a manufacturing method of the same which have good dropping characteristic, good temperature cycling characteristic and higher reliability than the conventional type, in the constitution in which the first mounted substrate to which the semiconductor elements were bonded and mounted with the solder has been mounted on the second substrate.

BRIEF DESCRIPTION OF THE DRAWINGS

FIGS. 4(a) and 4(b) are sectional views explaining manufacturing process in a case where a first mounted substrate with an electrode constitution of an LGA type is mounted on a second substrate according to Embodiment 1 of the present invention;

FIG. 5(a) is a principal sectional view illustrating bonding part of a mounted structure as a comparative example, where reinforcing member is not formed around the bonding part;

FIG. 5(b) is a principal sectional view illustrating bonding part of the mounted structure as a comparative example, where an interval between the first mounted substrate and the second substrate is sealed by reinforcing resin as an underfill.

MODES FOR CARRYING OUT INVENTION

Embodiment 1

In the following, a mounted structure according to Embodiment 1 of the present invention will be described, referring to FIG. 1(a) and FIG. 1(b).

Figure 1A:
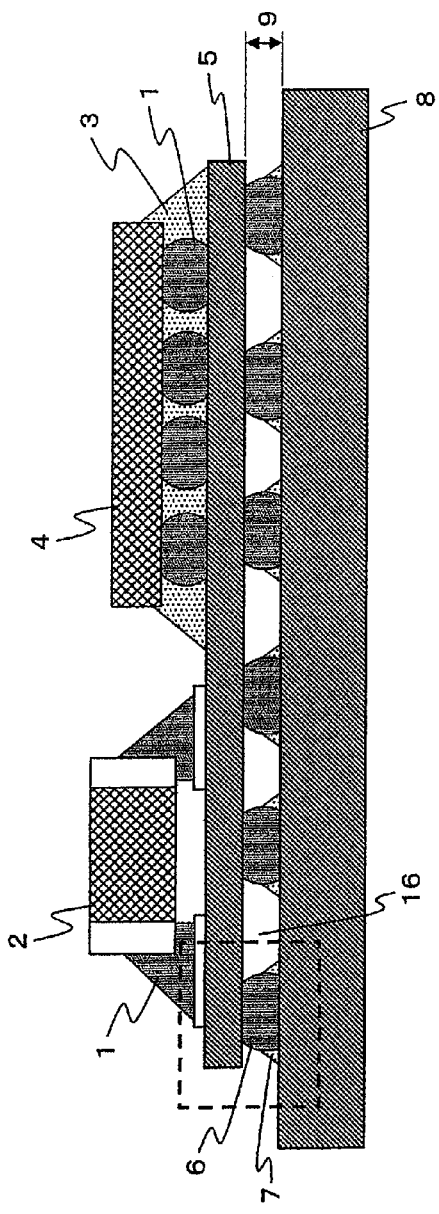
FIG. 1(a) is a sectional view illustrating a constitution of a mounted structure according to Embodiments 1 to 3 of the present invention.

FIG. 1(a) is a sectional view illustrating a constitution of a mounted structure according to the present Embodiment 1. FIG. 1(b) is a sectional view illustrating a bonding part of the mounted structure according to the present Embodiment 1, and is an enlarged schematic view illustrating a portion surrounded with the broken line in FIG. 1(a).

As shown in FIG. 1(a), a semiconductor element 4 such as a BGA package or an LGA package, and an electronic part 2 that is a chip part are bonded to a first mounted substrate 5 by solder 1 of 96.5Sn-3Ag-0.5Cu. The semiconductor element 4 such as a BGA package or an LGA package has been sealed to be reinforced by sealing material 3, because a crack is prone to occur in a temperature cyclic ageing test or a drop test when a bonding part becomes fine.

And, the first mounted substrate 5, on which the electronic part 2 and the sealed semiconductor element 4 have been mounted, has been mounted on a second substrate 8. The first mounted substrate 5 and the second substrate 8 have been mounted by bonding part 6 which contains solder having a melting point of 200° C. or less, and the circumference of the bonding part 6 is reinforced by a reinforcing member 7.

By the way, the solder 1 which bonds the semiconductor element 4 and the electronic part 2 to the first mounted substrate 5 is one example of a first solder of the present invention having a melting point of 217° C. or more, and the solder, which is contained in the bonding part 6 and has a melting point of 200° C. or less, is one example of a second solder of the present invention.

FIG. 2(a) to FIG. 2(d) show principal schematic sectional views illustrating bonding parts 6 in constitution examples in which reinforcing member 7 is formed around the bonding part. The same reference numerals are used with respect to the constitution portions corresponding to FIG. 1(a) and FIG. 1(b).

Figure 2A:
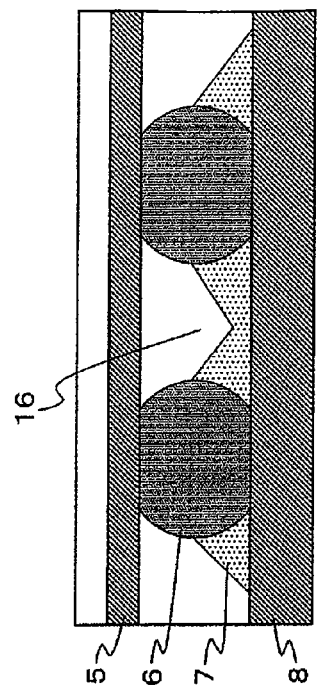
FIGS. 2(a)-2(d) are principal schematic sectional views illustrating bonding parts in constitution examples in which reinforcing member has been formed around the bonding part of a mounted structure according to Embodiments 1 to 3 of the present invention.
Figure 2B:
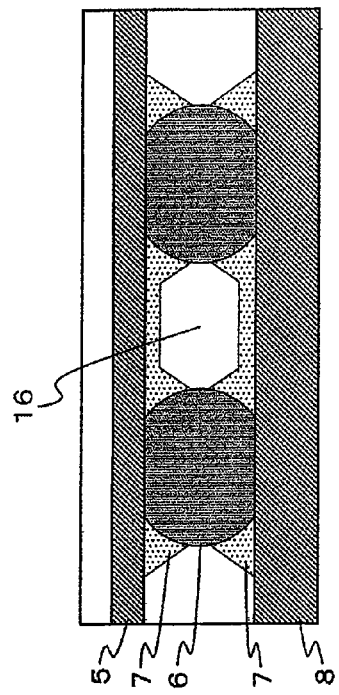
Figure 2C:
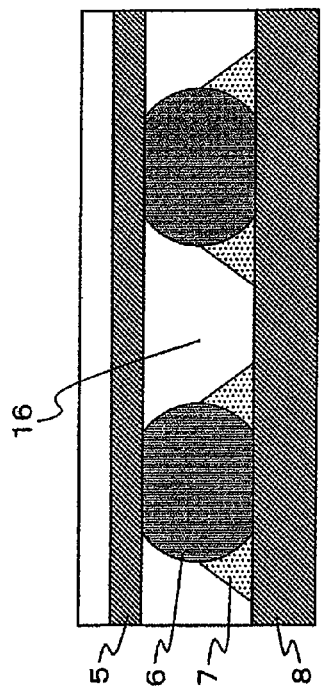
Figure 2D:
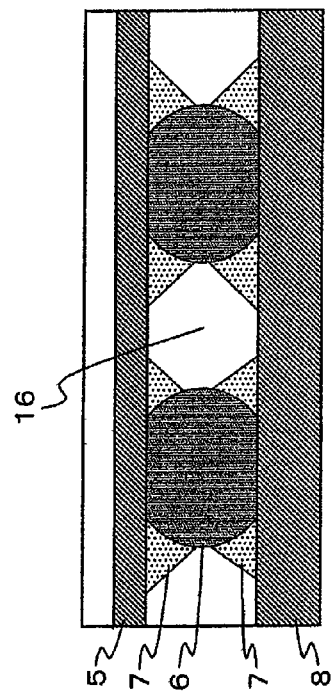

FIG. 2(a) shows a case where the reinforcing members 7 around the neighboring bonding parts 6 are not in contact with each other, FIG. 2(b) shows a case where the reinforcing members 7 around the neighboring bonding parts 6 are in contact with each other, FIG. 2(c) shows a case where the reinforcing members 7 around the bonding part 6 exist in a wet state on both the first mounted substrate 5 and the second substrate 8, and FIG. 2(d) shows a case where the reinforcing members 7 around the bonding part 6 exist in a wet state on both the first mounted substrate 5 and the second substrate 8 and the reinforcing members 7 around the neighboring bonding parts 6 are in contact with each other, respectively.

In any case of FIG. 2(a) to FIG. 2(d), there is a space (space 16 between bonding parts), where the reinforcing member 7 is not formed, between neighboring bonding parts 6 between the first mounted substrate 5 and the second substrate 8.

By the way, the bonding part 6 is one example of a bonding part of the present invention, and the reinforcing member 7 is one example of a reinforcing member of the present invention. Further, the space 16 between bonding parts is one example of a space of the present invention that exists between the reinforcing members which are formed on the bonding parts neighboring each other.

In this specification, the state where the reinforcing member 7 is formed without a break around the bonding part 6 corresponds to a state where reinforcing member is formed around each of the bonding parts of the present invention. As shown in FIGS. 2(a) to (d), any constitution, in which the reinforcing member 7 is formed without a break around the bonding part 6 at the portion where the bonding part 6 is in contact with the first mounted substrate 5 or the second substrate 8, denotes the constitution in which a reinforcing member is formed around a bonding part of the present invention.

Moreover, any constitution shown in FIG. 2(a) to FIG. 2(d) is also one example of constitution, in which a space exists between the reinforcing members which are formed on the bonding parts neighboring each other, of the present invention.

In a case where the electrode constitution of the first mounted substrate 5 is the BGA type, for the purpose of solving the above described problem, it is desirable that the constitution shown in FIG. 2(a) and FIG. 2(b) be carried out. Moreover, in a case where the electrode constitution of the first mounted substrate 5 is the LGA type, it is possible to solve the above described problem by applying the structure shown in FIG. 2(c) and FIG. 2(d). The constitution will be further described later by using FIG. 3 and FIG. 4.

Next, regarding a method for mounting the first mounted substrate 5 on the second substrate 8 according to the present Embodiment 1, explanation in a case where the first mounted substrate 5 of the BGA type is used and explanation in a case where the first mounted substrate 5 of the LGA type is used will be described separately.

In the present Embodiment 1, a compound material 13, which was obtained by mixing a solder having a melting point of 200° C. or less shown in Table 1 and a reinforcing resin containing an epoxy so that the ratio became 80 wt %:20 wt %, was used. As resin components of this reinforcing resin, "E806" produced by Japan Epoxy Resin Co., which is liquid bisphenol F type epoxy resin, and "EHI-I" produced by ADEKA CORPORATION, which is imidazole system curing agent thereof, were used.

By the way, the solder, which is contained in the compound material 13 and has the melting point of 200° C. or less shown in Table 1, is one example of a second solder of the present invention.

At first, by using FIG. 3(a) and FIG. 3(b), a mounting method in a case where the first mounted substrate 5 with an electrode constitution of the BGA type is bonded to the second substrate 8 will be described.

Figure 3A:
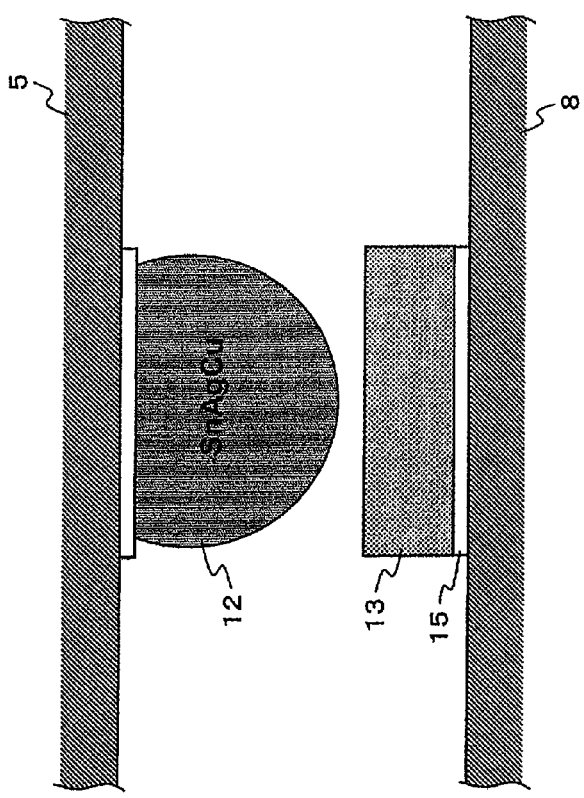
FIGS. 3(a) and 3(b) are sectional views explaining manufacturing process in a case where a first mounted substrate with an electrode constitution of a BGA type is mounted on a second substrate according to Embodiment 1 of the present invention.
Figure 3B:
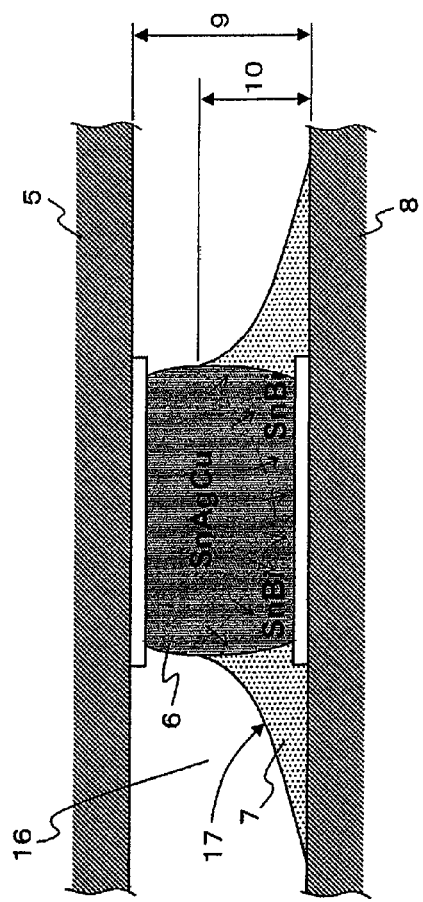
Figure 6:
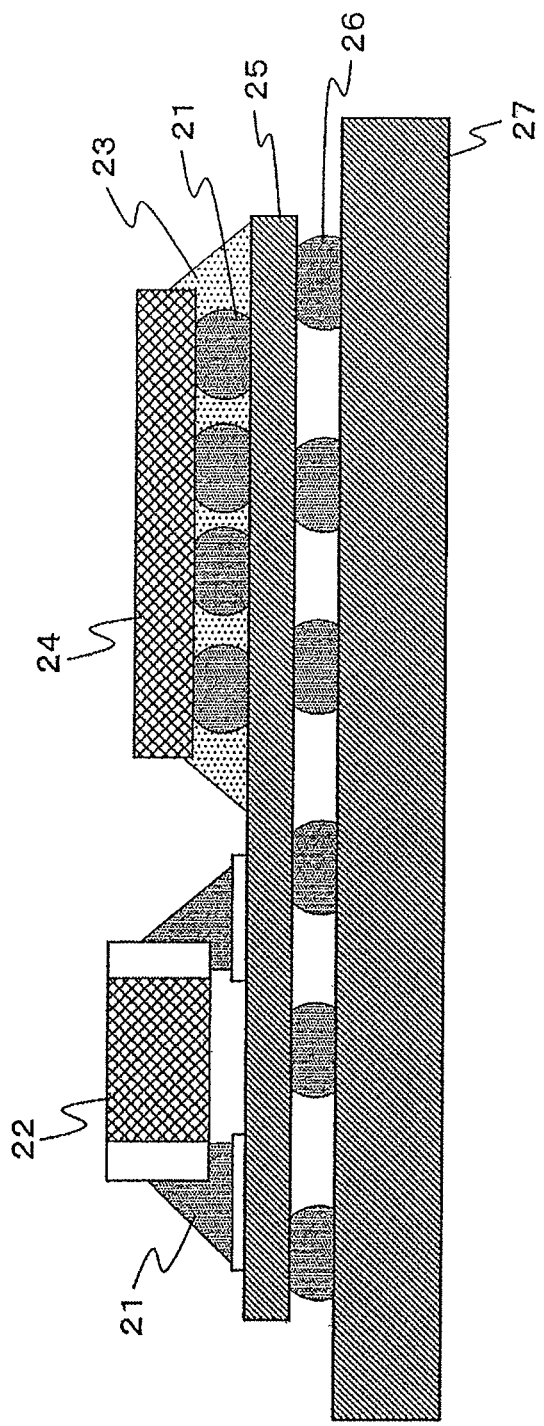
FIG. 6 is a sectional view illustrating a constitution of a bonding structure of the conventional electronic circuit board.

FIGS. 3(a) and 3(b) are sectional views explaining manufacturing process in a case where the first mounted substrate 5 with the electrode constitution of the BGA type is mounted on the second substrate 8. The same reference numerals are used for the constitution portions corresponding to FIG. 1(a) and FIG. 1(b).

At first, as shown in FIG. 3(a), the compound material 13 is printed on each of the electrodes 15, which have been formed on a plurality of portions of the second substrate 8, by a solder cream printer.

By the way, the process, in which the compound material 13 is printed on the electrodes 15 of the plurality of portions of the second substrate 8, is one example of a compound material supplying step of the present invention.

Next, as shown in FIG. 3(a), the positioning is performed in such a manner that the bump 12, which has been formed by the solder of Sn—Ag system, of the first mounted substrate 5 is aligned with the electrode 15 of the second substrate 8, and the first mounted substrate 5 is disposed on the second substrate 8. Here, as the first mounted substrate 5, the substrate of the BGA type, where the bump 12 with the diameter of 200 µm is formed in a pitch of 0.4 mm, was used.

By the way, the process where the first mounted substrate 5 is mounted on the second substrate 8 is one example of a mounted substrate disposing step of the present invention.

Then the compound material 13 and the bump 12 are heated at the predetermined temperature T, which is lower than the melting point (217° C. or more) of the first solder 1 that has bonded the electronic part 2 and the semiconductor element 4 to the first mounted substrate 5 and is higher than the melting point (200° C. or less) of the solder contained in the compound material 13, and pressing is carried out so that the bump 12 comes into contact with the compound material 13. As a result, as shown in FIG. 3(b), the soldering is performed by the bonding part 6, and at the same time, the reinforcing member 7 is formed by the reinforcing resin which melts out from the compound material 13 and gathers around the lower side of the bonding part 6, and the bonding of the bonding part 6 and the second substrate 8 is reinforced by the reinforcing member 7 that is in contact with the second substrate 8.

Regarding this bonding part 6, more description will be provided.

A broken line shown at the portion of the bonding part 6 in FIG. 3(b) shows a position of an interface between the bump 12 and the solder which was contained in the compound material 13 and has the melting point of 200° C. or less. When heating is performed at the predetermined temperature T, the solder that forms the bump 12 does not melt because of the melting point that is higher than 200° C., however, these solders are bonded firmly after cooling, because metal components (Sn, Ag and Cu) fuse into the solder portion which has been contained in the compound material 13 and has the melting point of 200° C. or less.

Moreover, the shape of surface 17, which faces the space 16 between bonding parts, of the reinforcing member 7 that was formed after the first mounted substrate 5 and the second substrate 8 were bonded, became concave form as shown in FIG. 3(b). In a case where the space between the first mounted substrate 5 and the second substrate 8 is filled to give sealing with the reinforcing member 7 as an underfill, the surface of the portion where the reinforcing member 7 is exposed does not become such concave form.

By the way, the process of bonding the first mounted substrate and the second substrate by heating the compound material 13 and the bump 12 is one example of a substrate bonding step of the present invention.

Next, by using FIG. 4(a) and FIG. 4(b), a mounting method in a case where the first mounted substrate 5 with an electrode constitution of the LGA type is bonded to the second substrate 8 will be described.

FIGS. 4(a) and 4(b) are sectional views explaining manufacturing process in a case where the first mounted substrate 5 with the electrode constitution of the LGA type is mounted on the second substrate 8. The same reference numerals are used for the constitution portions corresponding to FIG. 3(a) and FIG. 3(b).

At first, as shown in FIG. 4(a), the compound material 13 is printed on each of the electrodes 15, which have been formed on a plurality of portions of the second substrate 8, by a solder cream printer.

Next, as shown in FIG. 4(a), the positioning is performed in such a manner that the position of a plane electrode pad 14 which is formed on the first mounted substrate 5 is aligned with the position of the electrode 15 of the second substrate 8, and the first mounted substrate 5 is disposed on the second substrate 8. Here, as the first mounted substrate 5, the substrate of the LGA type, where the plane electrode pad 14 with the diameter of 200 µm is formed in a pitch of 0.4 mm, was used.

Then the compound material 13 is heated at the predetermined temperature T, which is lower than the melting point (217° C. or more) of the first solder 1 that has bonded the electronic part 2 and the semiconductor element 4 to the first mounted substrate 5 and is higher than the melting point (200° C. or less) of the solder contained in the compound material 13, and pressing is carried out so that the plane electrode pad 14 comes into contact with the compound material 13. As a result, as shown in FIG. 4(b), the soldering is performed by the bonding part 6, and at the same time, the reinforcing member 7 is formed on a side of the first mounted substrate 5 and a side of the second substrate 8 by the reinforcing resin which melts out from the compound material 13 and gathers around the upper side and the lower side of the bonding part 6, and the bonding of the bonding part 6 and the first mounted substrate 5 is reinforced by the reinforcing member 7, and the bonding of the bonding part 6 and the second substrate 8 is reinforced by the reinforcing member 7.

In this case, as shown in FIG. 4(b), the reinforcing member 7 is formed so as to come into contact with the second substrate 8 and also come into contact with the first mounted substrate 5.

Moreover, the shape of each surface 17, which faces the space 16 between bonding parts, of the reinforcing members 7 that were formed after the first mounted substrate 5 and the second substrate 8 were bonded, became concave form as shown in FIG. 4(b) with respect to the portions in contact with any one of the first mounted substrate 5 and the second substrate 8.

As described above, in a case of the first mounted substrate 5 of the BGA type, the bonding of the bonding part 6 and the second substrate 8 at the lower side is reinforced by the reinforcing member 7. In a case of the first mounted substrate 5 of the LGA type, the bonding of the bonding part 6 and the first mounted substrate 5 at the upper side is reinforced by the reinforcing member 7, and the bonding of the bonding part 6 and the second substrate 8 at the lower side is reinforced by the reinforcing member 7.

By the way, each of the bonding part 6 which is formed by bonding of the bump 12 and the solder with the melting point of 200° C. or less in the case of utilizing the first mounted substrate 5 of the BGA type, and the bonding part 6 which is formed only by the solder with the melting point of 200° C. or less in the case of utilizing the first mounted substrate 5 of the LGA type is one example of a bonding part of the present invention.

In the manufacturing process of these mounted structures, material adjustment was possible even when the ratio of the reinforcing resin in the compound material 13 is changed between 10 wt % and 25 wt %, however, a height of the reinforcing member 10 with respect to a height of the bonding part 9 was changed.

By the way, as shown in FIG. 3(b) and FIG. 4(b), the height of the bonding part 9 means a distance between the first mounted substrate 5 and the second substrate 8 at a portion where the bonding part 6 has been formed, and is one example of a distance between the substrates, of the present invention.

Moreover, as shown in FIG. 3(b) and FIG. 4(b), the height of the reinforcing member 10 means the height of the reinforcing member 7, which have been formed on the surface of the bonding part 6, with reference to the first mounted substrate 5 or the second substrate 8. As shown in FIG. 2(c) and FIG. 2(d), in the case where the reinforcing members 7 exist in a wet state on both the first mounted substrate 5 and the second substrate 8, each of the height from the first mounted substrate 5 and the height from the second substrate 8 is the height of the reinforcing member 10.

In the present Embodiment 1, in the case where the first mounted substrate 5 of the BGA type was mounted on the second substrate 8 by using the compound material 13 which was obtained by mixing the solder with the melting point of 200° C. or less and the reinforcing resin containing the epoxy so that the ratio became 80 wt %:20 wt %, the height of the reinforcing member 10 after bonding was about ⅓ of the height of the bonding part 9. In this case, the shape of the reinforcing member 7 which has been formed around the bonding part 6 was of the constitution in which the reinforcing members 7 around the neighboring bonding parts 6 were not in contact with each other, as shown in FIG. 2(a).

In a case where the first mounted substrate 5 and the second substrate 8 are bonded by using the compound material 13 which contains the solder with the melting point of 200° C. or less and is shown in Table 1, if the reinforcing member 7 does not exist around the bonding part 6 which contains the solder with the melting point of 200° C. or less, weakness of bonding strength causes poor connection. In the method in which the reinforcing member 7 is supplied after soldering by the dispenser, since it is difficult to infiltrate reinforcing member 7 equally and it is difficult to reinforce the circumferences of all bonding parts 6, defectiveness increases. Moreover, in the case of the reinforcing member 7 which has been formed by the method of supplying with the dispenser, the shape of the reinforcing-member surface 17 does not become the concave form like shown in FIG. 3(b) or FIG. 4(b).

Incidentally, in the case where the first mounted substrate 5 is the BGA type, as shown in FIG. 3(b), since the bonding part 6 of a portion which is bonded to the first mounted substrate 5 is a solder component which has the high melting point and had formed the bump 12, and the connection state between the first mounted substrate 5 and the bonding part 6 is good, the portion, which is bonded to the first mounted substrate 5, does not need to be reinforced by the reinforcing member 7.

About the mounted structures which were made by changing, using the substrate of the BGA type as the first mounted substrate 5, the composition of solder contained in the bonding part 6 of the portion that is bonded to the second substrate 8 and the reinforcing state, the result of performing the temperature cyclic ageing test and the drop test is shown in Table 1.

TABLE 1

| | Composition of solder (mass %) | | | | | Melting point | | Dropping characteristic | Temperature cyclic ageing |
|---|---|---|---|---|---|---|---|---|---|
| | Sn | Ag | Bi | In | Cu | (° C.) | Reinforcement | (cycle) | (cycle) |
| Example 1 | Bal. | | 50 | 20 | | 105 | Circumference of bonding part | 10 | 1000 |
| Example 2 | Bal. | | 50 | 24 | | 98 | Circumference of bonding part | 10 | 1000 |
| Example 3 | Bal. | | 52.5 | 17.5 | | 103 | Circumference of bonding part | 10 | 1000 |
| Example 4 | Bal. | | 52.5 | 20 | | 98 | Circumference of bonding part | 10 | 1000 |
| Example 5 | Bal. | | 55 | 10 | | 110 | Circumference of bonding part | 10 | 1000 |
| Example 6 | Bal. | | 55 | 17.5 | | 100 | Circumference of bonding part | 10 | 1000 |
| Example 7 | Bal. | | 55 | 20 | | 96 | Circumference of bonding part | 8 | 800 |
| Example 8 | Bal. | | 65 | 15 | | 99 | Circumference of bonding part | 8 | 800 |
| Example 9 | Bal. | | 70 | 24 | | 70 | Circumference of bonding part | 8 | 800 |
| Example 10 | Bal. | | 57 | 10 | | 115 | Circumference of bonding part | 10 | 1000 |
| Example 11 | Bal. | | 57 | 15 | | 105 | Circumference of bonding part | 10 | 1000 |
| Example 12 | Bal. | | 55 | 25 | | 85 | Circumference of bonding part | 8 | 800 |
| Example 13 | Bal. | | 57 | 25 | | 80 | Circumference of bonding part | 8 | 800 |
| Example 14 | Bal. | | 60 | 25 | | 79 | Circumference of bonding part | 8 | 800 |
| Example 15 | Bal. | | 58 | | | 138 | Circumference of bonding part | 10 | 1000 |
| Example 16 | Bal. | | | 25 | | 140 | Circumference of bonding part | 8 | 800 |
| Comparative example 1 | Bal. | 3 | | | 0.5 | 217 | Non | 3 | 800 |
| Comparative example 2 | Bal. | | 50 | 20 | | 105 | Non | 1 | 500 |
| Comparative example 3 | Bal. | | 50 | 24 | | 98 | Non | 1 | 500 |
| Comparative example 4 | Bal. | | 52.5 | 17.5 | | 103 | Non | 1 | 500 |
| Comparative example 5 | Bal. | | 52.5 | 20 | | 98 | Non | 1 | 500 |
| Comparative example 6 | Bal. | | 55 | 10 | | 110 | Non | 1 | 500 |
| Comparative example 7 | Bal. | | 55 | 17.5 | | 100 | Non | 1 | 500 |
| Comparative example 8 | Bal. | | 55 | 20 | | 96 | Non | 0 | 400 |
| Comparative example 9 | Bal. | | 65 | 15 | | 99 | Non | 0 | 400 |
| Comparative example 10 | Bal. | | 70 | 24 | | 70 | Non | 0 | 400 |
| Comparative example 11 | Bal. | | 57 | 10 | | 115 | Non | 1 | 500 |
| Comparative example 12 | Bal. | | 57 | 15 | | 105 | Non | 1 | 500 |
| Comparative example 13 | Bal. | | 55 | 25 | | 85 | Non | 0 | 400 |
| Comparative example 14 | Bal. | | 57 | 25 | | 80 | Non | 0 | 400 |
| Comparative example 15 | Bal. | | 60 | 25 | | 79 | Non | 0 | 400 |
| Comparative example 16 | Bal. | | 58 | | | 138 | Non | 1 | 500 |
| Comparative example 17 | Bal. | | | 25 | | 140 | Non | 0 | 400 |
| Comparative example 18 | Bal. | | 50 | 20 | | 105 | Underfill | 20 | 400 |
| Comparative example 19 | Bal. | | 50 | 24 | | 98 | Underfill | 20 | 400 |
| Comparative example 20 | Bal. | | 52.5 | 17.5 | | 103 | Underfill | 20 | 400 |
| Comparative example 21 | Bal. | | 52.5 | 20 | | 98 | Underfill | 20 | 400 |
| Comparative example 22 | Bal. | | 55 | 10 | | 110 | Underfill | 20 | 400 |
| Comparative example 23 | Bal. | | 55 | 17.5 | | 100 | Underfill | 20 | 400 |
| Comparative example 24 | Bal. | | 55 | 20 | | 96 | Underfill | 15 | 300 |
| Comparative example 25 | Bal. | | 65 | 15 | | 99 | Underfill | 15 | 300 |

TABLE 1-continued

| | Composition of solder (mass %) | | | | | Melting point | | Dropping characteristic | Temperature cyclic ageing |
|---|---|---|---|---|---|---|---|---|---|
| | Sn | Ag | Bi | In | Cu | (° C.) | Reinforcement | (cycle) | (cycle) |
| Comparative example 26 | Bal. | | 70 | 24 | | 70 | Underfill | 15 | 300 |
| Comparative example 27 | Bal. | | 57 | 10 | | 115 | Underfill | 20 | 400 |
| Comparative example 28 | Bal. | | 57 | 15 | | 105 | Underfill | 20 | 400 |
| Comparative example 29 | Bal. | | 55 | 25 | | 85 | Underfill | 15 | 300 |
| Comparative example 30 | Bal. | | 57 | 25 | | 80 | Underfill | 15 | 300 |
| Comparative example 31 | Bal. | | 60 | 25 | | 79 | Underfill | 15 | 300 |
| Comparative example 32 | Bal. | | 58 | | | 138 | Underfill | 20 | 400 |
| Comparative example 33 | Bal. | | | 25 | | 140 | Underfill | 15 | 300 |

Note)
"Bal."in Table 1 stands for "Balance".

Regarding the mounted structures, which were used in the drop test and the temperature cyclic ageing test, the following structures are used.

The semiconductor element 4 (the size 10 mm square and the thickness of 1 mm) and the electronic part 2 of a 1005 chip part were mounted on a glass epoxy substrate of FR-4 and the thickness of 0.3 mm so that they were in line like the arrangement of the first mounted substrate 5 shown in FIG. 1(a) by using the solder of 96.5Sn-3Ag-0.5Cu. Regarding the semiconductor element 4, the sealing material 3 was injected by the dispenser and hardened at 150° C. and for 30 minutes in a hot bath to produce the first mounted substrate 5. Incidentally, the sealing material 3 used here was a 1572 produced by NAMICS Co., Ltd.

The respective mounted substrates, in which this first mounted substrate 5 was bonded to the second substrate 8 that was a glass epoxy substrate of FR-4 and the thickness of 0.5 mm, were produced by using a plurality of solders having different compositions shown in Table 1 as the solder contained in the bonding part 6. Moreover, mounted substrates, in which the reinforcing states between the first mounted substrate 5 and the second substrate 8 were different, were produced in this way, and the drop test and the temperature cyclic ageing test were performed with respect to each mounted structure of these mounted structures.

FIG. 5(a) is a principal sectional view illustrating bonding part 6 of the constitution where the reinforcing member 7 is not formed around the bonding part 6, and FIG. 5(b) is a principal sectional view illustrating bonding part 6 where an interval between the first mounted substrate 5 and the second substrate 8 is sealed by reinforcing member 7 as an underfill.

In each case of the comparative examples 2 to 17 of Table 1, the reinforcing member 7 is not formed between the first mounted substrate 5 and the second substrate 8, the compositions of solder contained in the respective bonding parts 6 are allowed to be different from each other, and the constitution is shown in FIG. 5(a).

In each case of the comparative examples 18 to 33 of Table 1, after the bonding part 6 was formed by soldering rather than using the compound material 13, the reinforcing resin was injected by the dispenser to fill the space between the first mounted substrate 5 and the second substrate 8 with the reinforcing resin to perform the sealing as an underfill with respect to each mounted structure of the constitution of the comparative examples 2 to 17, and the constitution is shown in FIG. 5(b).

Each of the examples 1 to 16 of the Table 1 is a mounted structure of the constitution of the present Embodiment 1, in which the reinforcing member 7 is formed around the bonding part 6 as shown in FIG. 2(a) by using a compound material 13, which has been obtained by mixing a solder having the same composition as the composition of each solder of the comparative examples 2 to 17 and a reinforcing resin containing an epoxy so that the ratio becomes 80 wt %:20 wt %.

By the way, the comparative example 1 of the Table 1 is a mounted structure, in which the first mounted substrate 5 is mounted on the second substrate 8 by using the conventional solder of 96.5Sn-3Ag-0.5Cu as a substitute for the solder that is contained in the bonding part 6 and has a melting point of 200° C. or less.

Regarding each of these mounted substrates, the 6-face drop test as one cycle was performed from height of 1.5 m, and the numbers of dropping were compared.

Regarding each of these mounted substrates, the temperature cyclic ageing test was performed from −40° C. to 85° C. (30 minutes at each temperature), and the cycles obtained when the crack of the bonding part 6 occurred were compared.

In the drop test, the judgment standard of good was such that 5 cycles or more were obtained, and in the temperature cyclic ageing test, the judgment standard of good was such that 500 cycles or more were obtained. Then, it was an aim to acquire the mounted structure overcoming both of the drop test and the temperature cyclic ageing test.

It is understood that the melting point becomes lower than the melting point of the conventional solder of 96.5Sn-3Ag-0.5Cu shown in the comparative example 1 by adding Bi and In to Sn as shown in Table 1. Moreover, in the case of adding Bi or In to Sn, the dropping characteristic and the temperature cycling characteristic in the case of not reinforcing (comparative examples 2 to 17) deteriorate as compared with the conventional solder of 96.5Sn-3Ag-0.5Cu (comparative example 1).

Like this, in the case of the conventional Sn—Bi system solder having the melting point of 200° C. or less, if there is no reinforcement, the mechanical strength is comparatively low and the improvement of the reinforcement is a problem at utilization.

Moreover, in the case of the method where the reinforcing resin is injected by the dispenser to fill the space between the first mounted substrate 5 and the second substrate 8 with the reinforcing resin to perform the sealing as an underfill after soldering, as shown in the results of the comparative examples 18 to 33, it is understood that the dropping characteristic which is equal to or superior to the dropping characteristic of the conventional solder of 96.5Sn-3Ag-0.5Cu (comparative example 1) is obtained, but that in the case of performing the temperature cyclic ageing test, the temperature cyclic characteristic is lowered because of the heat stress which arises by repetition of expansion and contraction of the reinforcing member 7. Therefore, the improvement of the temperature cyclic characteristic is a problem.

The examples 1 to 16 of the Table 1 show the following. That is to say, even when the first mounted substrate 5 and the second substrate 8 are mounted by the solder of the melting point of 200° C. or less, by reinforcing the circumference of the bonding part 6 with the reinforcing member 7 certainly, the reliability of the dropping characteristic and the temperature cyclic characteristic of the mounted structure that is constructed by the first mounted substrate 5 and the second substrate 8 improves, and the reliability that is equivalent to that of the conventional solder of 96.5Sn-3Ag-0.5Cu shown in the comparative example 1 or more can be obtained.

Regarding the drop test, by adopting the constitution of the present Embodiment 1 (examples 1 to 16), since a crash force was reduced according to the reinforcement effect that is owing to reinforcing the circumference of the bonding part 6 bonding the first mounted substrate 5 and the second substrate 8, it became possible to improve the dropping characteristic of the bonding part 6 that contains the solder of the melting point of 200° C. or less.

Regarding the temperature cyclic characteristic of the Table 1, in the case where the reinforcing member 7 exists only around the bonding part 6 (examples 1 to 16), the temperature cyclic characteristic improves as compared with those without reinforcement (comparative examples 2 to 17). This is owing to the reinforcement effect by the reinforcing member Moreover, in the case where the reinforcing member 7 exists only around the bonding part 6 (examples 1 to 16), the temperature cyclic characteristic improves, even when these examples are compared with the case of the underfill (comparative examples 18 to 33) where the reinforcing member 7 is infiltrated into the interval between the first mounted substrate 5 and the second substrate 8 without a gap. It is because, in the case of filling the interval with a member as the underfill, the heat distortion of the first mounted substrate 5 and the second substrate 8 becomes large by the thermal expansion of the reinforcing member 7 which is in contact with the first mounted substrate 5 and the second substrate 8. On the other hand, in the case where the reinforcing member 7 exists only around the bonding part 6, since the amount of thermal expansion of the reinforcing member 7 can be reduced, the heat distortion of the first mounted substrate 5 and the second substrate 8 can be reduced, and the stress to the bonding part 6 can be suppressed. Therefore, the temperature cyclic characteristic can be improved as compared with the case of filling the interval with the reinforcing member 7 as the underfill.

Like this, by adopting the constitution in which a space exists between the reinforcing members 7 that are formed at the neighboring bonding parts 6, the temperature cyclic characteristic can be improved.

That is to say, when a volume between the first mounted substrate 5 and the second substrate 8 is denoted as V0, a sum total volume of respective bonding parts 6, which are formed between the first mounted substrate 5 and the second substrate 8, is denoted as V1, and a sum total volume of respective reinforcing members 7, which are formed between the first mounted substrate 5 and the second substrate 8, is denoted as V2, the temperature cyclic characteristic can be improved by adopting the constitution in which a formula of V0−V1−V2>0 is established for the constitution of the mounted structure.

As described above, the mounted structure of the present Embodiment 1 is a bonding structure which utilized the solder which is characterized in that Sn and at least one of Bi and In are basic compositions and has the melting point of 200° C. or less. The mounted structure of the present Embodiment 1 can have the bonding part 6 that contains the solder having the melting point of 200° C. or less, and has a constitution in which the circumferences of these bonding parts 6 are reinforced at least.

Moreover, by utilizing the material which is characterized in that, for example, Sn and at least one of Bi and In are basic compositions and is compounded with the metallic particle and the reinforcing material, the mounted structure of the present Embodiment 1 can be realized. The compound material 13 used in the present Embodiment 1 is a solder paste which can also have a low melting point of 100° C. or less, and is different from the conventional solder material of 96.5Sn-3Ag-0.5Cu.

In the present Embodiment 1, the composition of the solder, which is used as the solder that is contained in the bonding part 6 and has the melting point of 200° C. or less, is an alloy composition that contains at least one metal selected from Bi and In and the residue is Sn. Bi and In are combined for the purpose of lowering the melting point of the alloy. One example of the composition of the solder having the melting point of 200° C. or less is shown below.

When the Bi content in the composition of the solder having the melting point of 200° C. or less is in the range between 50 and 70 wt %, coexistence of the low melting point and the high reliability is possible, because the extension becomes extremely large. The Bi content in the composition of the solder having the melting point of 200° C. or less is set in the range between 50 and 70 wt %, because, in the case where the Bi content is less than 50 wt %, the effect of lowering the melting point is not provided sufficiently, and in the case where the Bi content exceeds 70 wt %, the extension decreases.

It is desirable that the In content in the component of the solder having the melting point of 200° C. or less be in the range between 10 and 25 wt %, and coexistence of the low melting point and the high reliability is possible, because the extension becomes extremely large. The In content in the metal component is set in the range between 10 and 25 wt %, because, in the case where the In content is less than 10 wt %, the effect of lowering the melting point is not provided sufficiently, and in the case where the In content exceeds 25 wt %, the extension decreases.

The Bi content and the In content show the above mentioned characteristic, even when each of them is contained solely, and even when both of them are contained simultaneously.

Like this, as shown in FIG. 1(*a*), the mounted structure of the present Embodiment 1 has the constitution in which the reinforcement is performed by forming the reinforcing members 7 at the circumferences of all the bonding parts 6 in the case where the first mounted substrate 5 is mounted on the second substrate 8, when the mounted structure has the mounted structure which has the bonding part 6 containing the solder material that enables a lower mounting temperature to be realized in comparison with the solder of Sn—Ag system. By means of this, the mounted structure with the high reliability can be obtained, even when the bonding part 6 contains the solder of the low melting point.

Embodiment 2

Figure 1B:
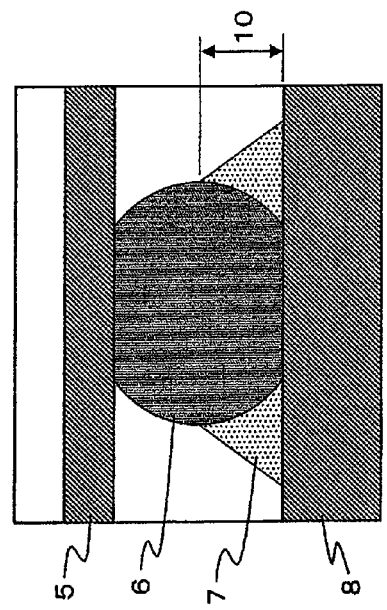
FIG. 1(b) is a principal schematic sectional view illustrating a bonding part of a mounted structure according to Embodiments 1 to 3 of the present invention.

In Embodiment 2 of the present invention, the height of reinforcing member 10, which is formed around the bonding part 6 shown in FIG. 1(b), has been made to become different in the mounted structure of the constitution shown in FIG. 1(a).

In the present Embodiment 2, as to the mounted structure of the constitution shown in FIG. 1(a), the first mounted substrate 5 of BGA type was mounted on the second substrate 8 by using the compound material 13, which was obtained by changing the combining ratio of the solder and the reinforcing resin containing the epoxy, the solder used as the solder contained in the bonding part 6 being of the composition of solder (42Sn-58Bi) of the example 15 shown in Table 1.

By changing the ratio of this reinforcing resin between 10 and 25 wt %, the compound material 13 was made. In the combining ratio of the solder having the melting point of 200° C. or less and the reinforcing resin, when the ratio of the reinforcing resin is raised, the height of reinforcing member 10 becomes higher and the reinforcement effect becomes higher, however, when the ratio of the reinforcing resin exceeds 25 wt %, the viscosity of the compound material 13 becomes lower, so that compound material 13 flags and spreads, and desired forms or properties are not securable.

The compound material 13, which was obtained by changing the combining ratio of the solder having the melting point of 200° C. or less and the reinforcing resin, was supplied on the bonding portion with electrode pitch of 0.85 mm, and the height of reinforcing member 10 around the bonding part 6 was allowed to change. Then, the drop test and the temperature cyclic ageing test, which are the same as those of the Embodiment 1, were carried out with respect to each mounted structure having the different height of reinforcing member 10. The results are shown in Table 2.

mounted substrate 5 and is in contact with the second substrate 8.

The examples 23 to 27 of the Table 2 show the following. That is to say, in a case where the height of reinforcing member 10 is ⅕ or more of the distance between the substrates (height of bonding part 9), the dropping characteristic is equivalent to that of the conventional 96.5Sn-3Ag-0.5Cu (comparative example 1) or more. However, the comparative example 42 shows the following. That is to say, in a case where the height of reinforcing member 10 is lower than it, the reinforcement effect by the reinforcing member 7 is not obtained. The amount of combination of the reinforcing resin in the compound material 13, by which the height of the reinforcing member 10 becomes ⅕ or more of the distance between the substrates, is 10 wt % or more.

In the case where the first substrate 5 is the BGA type, as shown in FIG. 3(b), since the bonding state between the bonding part 6 and the first mounted substrate 5 is good and the bonding part does not need to be reinforced, the height of the reinforcing member 10 that is only on the side, where the bonding part 6 is in contact with the second substrate 8, needs to become ⅕ or more of the distance between the substrates.

On the other hand, in the case where the first substrate 5 is the LGA type, as shown in FIG. 4(b), since the configuration is such that the solder having the melting point of 200° C. or less is also bonded to the first mounted substrate 5, the portion, where the bonding part 6 is bonded to the first mounted substrate 5, also needs to be reinforced. Therefore, in this case, on each of the side where the bonding part 6 is bonded to the first mounted substrate 5, and the side where the bonding part 6 is bonded to the second substrate 8, the

TABLE 2

| | Composition of solder (mass %) | | | | Melting point | | Height of reinforcing resin (ratio to distance between | Dropping characteristic | Temperature cyclic ageing |
|---|---|---|---|---|---|---|---|---|---|
| | Sn | Bi | Ag | Cu | (° C.) | Reinforcement | substrates) | (cycle) | (cycle) |
| Example 23 | 42 | 58 | | | 138 | Circumference of bonding part | 0.2 | 10 | 1000 |
| Example 24 | 42 | 58 | | | 138 | Circumference of bonding part | 0.25 | 10 | 1000 |
| Example 25 | 42 | 58 | | | 138 | Circumference of bonding part | 0.3 | 10 | 1000 |
| Example 26 | 42 | 58 | | | 138 | Circumference of bonding part | 0.5 | 10 | 1000 |
| Example 27 | 42 | 58 | | | 138 | Circumference of bonding part | 1 | 10 | 1000 |
| Comparative example 42 | 42 | 58 | | | 138 | Circumference of bonding part | 0.1 | 0 | 500 |

As for resin components of the reinforcing resin used as the reinforcing member 7, "E806" produced by Japan Epoxy Resin Co., which is liquid bisphenol F type epoxy resin, and "EHI-I" produced by ADEKA CORPORATION, which is imidazole system curing agent thereof, were used.

In the Table 2, the average of height of the reinforcing members 7 formed around the soldering portions is expressed as the height of reinforcing member 10.

By the way, except for the example 27 in the Table 2, the shape of the reinforcing member 7 formed around the bonding part 6 is of a configuration shown in FIGS. 2(a) and 2(b), in which the member is not in contact with the first height of reinforcing member 10 is allowed to become ⅕ or more of the distance between the substrates, thereby, the good dropping characteristic can be obtained.

In any constitution of the examples 23 to 27, the volume of the whole of the space 16 between bonding parts, which was sandwiched between the first mounted substrate 5 and the second substrate 8, was larger than the sum total volume of the reinforcing members 7 which were formed at the circumferences of all bonding parts 6 between the first mounted substrate 5 and the second substrate 8.

Like this, in the above mentioned compound material 13 in which the combining ratio of the reinforcing resin is between 10 and 25 wt %, the volume of the whole of the space 16 between bonding parts, which is sandwiched between the first mounted substrate 5 and the second substrate 8, becomes larger than the sum total volume of the reinforcing members 7, which were formed at the circumferences of all bonding parts 6 of the first mounted substrate 5 and the second substrate 8, not depending on the placement of the electrode of the first mounted substrate 5 to the substrate, in a case where the first mounted substrate 5 and the second substrate 8 were tied by the electrode of the pitch of 0.4 mm or more.

On the other hand, when the first mounted substrate 5 and the second substrate 8 were tied by the electrode of the pitch of 0.3 mm or more, in a case of the configuration in which the electrodes of the first mounted substrate 5 are disposed on the whole surface of the reverse side of the substrate, the volume of the whole of the space 16 between bonding parts, which was sandwiched between the first mounted substrate 5 and the second substrate 8, became smaller than the sum total volume of the reinforcing members 7 which were formed at the circumferences of all bonding parts 6 of the first mounted substrate 5 and the second substrate 8.

In the case of the above described electrodes of the pitch of 0.4 mm or more, the temperature cyclic characteristic has not been lowered, however, in the case of the configuration in which the electrodes of the pitch of 0.3 mm are disposed on the whole surface of the reverse side of the first mounted substrate 5, the temperature cyclic characteristic has been lowered.

The foregoing indicates that the temperature cyclic characteristic improves, when the volume of the whole of the space 16 between bonding parts, which is sandwiched between the first mounted substrate 5 and the second substrate 8, becomes larger than the sum total volume of the reinforcing members 7, which are formed around bonding parts 6 of the first mounted substrate 5 and the second substrate Even when the first mounted substrate 5 and the second substrate 8 are tied by the electrode of the pitch of 0.3 mm or more, if the electrodes of the first mounted substrate 5 are allowed not be disposed on the whole surface of the reverse side, it is possible to make the volume of the whole of the space 16 between bonding parts, which is sandwiched between the first mounted substrate 5 and the second substrate 8, become larger than the sum total volume of the reinforcing members 7 which are formed at the circumferences of all bonding parts 6 of the first mounted substrate 5 and the second substrate 8. Then, it is possible to make the temperature cyclic characteristic improve.

Embodiment 3

In Embodiment 3 of the present invention, a thickness of the first mounted substrate 5 has been made to become different in the mounted structure of the constitution shown in FIG. 1(*a*).

In the present Embodiment 3, as to the mounted structure of the constitution shown in FIG. 1(*a*), the compound material 13 was used, which was obtained by mixing the solder and the reinforcing resin containing the epoxy so that the ratio became 80 wt %:20 wt %, the solder used as the solder contained in the bonding part 6 being of the composition of solder (42Sn-58Bi) of the example 15 shown in Table 1.

As for resin components of the reinforcing resin used as the reinforcing member 7, "E806" produced by Japan Epoxy Resin Co., which is liquid bisphenol F type epoxy resin, and "EHI-I" produced by ADEKA CORPORATION, which is imidazole system curing agent thereof, were used.

In the present Embodiment 3, the thickness of the second substrate 8 is allowed to be 0.8 mm.

Then, the thickness of the first mounted substrate 5 of BGA type was allowed to change between 0.25 and 0.80 mm, and the drop test and the temperature cyclic ageing test, which are the same as those of the Embodiment 1, were carried out with respect to the mounted structures of the constitution in which the circumference of the bonding part 6 is reinforced and the mounted structures of the constitution in which the circumference of the bonding part 6 is not reinforced. The results are shown in Table 3.

TABLE 3

| | Composition of solder (mass %) | | Melting point (° C.) | Thickness of substrate (mm) | Reinforcement | Dropping characteristic (cycle) | Temperature cyclic ageing (cycle) |
|---|---|---|---|---|---|---|---|
| | Sn | Bi | | | | | |
| Example 17 | 42 | 58 | 138 | 0.25 | Circumference of bonding part | 10 | 1000 |
| Example 18 | 42 | 58 | 138 | 0.3 | Circumference of bonding part | 10 | 1000 |
| Example 19 | 42 | 58 | 138 | 0.45 | Circumference of bonding part | 10 | 1000 |
| Example 20 | 42 | 58 | 138 | 0.5 | Circumference of bonding part | 10 | 1000 |
| Example 21 | 42 | 58 | 138 | 0.65 | Circumference of bonding part | 10 | 1000 |
| Example 22 | 42 | 58 | 138 | 0.8 | Circumference of bonding part | 10 | 1000 |
| Comparative example 34 | 42 | 58 | 138 | 0.25 | Non | 0 | 200 |
| Comparative example 35 | 42 | 58 | 138 | 0.3 | Non | 0 | 300 |
| Comparative example 36 | 42 | 58 | 138 | 0.45 | Non | 0 | 400 |
| Comparative example 37 | 42 | 58 | 138 | 0.5 | Non | 1 | 500 |
| Comparative example 38 | 42 | 58 | 138 | 0.65 | Non | 1 | 600 |

TABLE 3-continued

| | Composition of solder (mass %) | | Melting point | Thickness of substrate | | Dropping characteristic | Temperature cyclic ageing |
|---|---|---|---|---|---|---|---|
| | Sn | Bi | (° C.) | (mm) | Reinforcement | (cycle) | (cycle) |
| Comparative example 39 | 42 | 58 | 138 | 0.8 | Non | 1 | 600 |

The examples 17 to 22 shown in Table 3 are the mounted structures of the constitution of the present Embodiment 3, in which the reinforcing member 7 is formed around the bonding part 6 as shown in FIG. 1(a), and the comparative examples 34 to 39 are the mounted structures which are not reinforced and correspond to the examples 17 to 22, respectively.

It is understood that in a case of the first mounted substrate 5 with the thickness which is less than 0.5 mm, the deterioration of the reliability is caused notably as shown in the results of the comparative examples 34 to 39, from the results of the temperature cycling ageing test of Table 3.

On the other hand, based on the results of the examples 17 to 20 of the Table 3, it is understood that even when the thickness of the first mounted substrate 5 is less than 0.5 mm, the deterioration of the reliability can be prevented by the constitution in which the reinforcing member 7 is formed around the bonding part 6 as shown in FIG. 1(a) and FIG. 1(b)

Therefore, in the case where the bonding part 6 contains the solder of the melting point of 200° C. or less, the constitution of the present Embodiment 3 as shown in FIG. 1(a) is effective in the mounted structure in which the thickness of the first mounted substrate 5 is less than 0.5 mm, and is effective especially in the mounted structure in which the thickness of the first mounted substrate 5 is equal to or less than 0.45 mm.

As described above, the mounted structure of the present invention is characterized in that the temperature at which the first mounted substrate 5 is bonded to the second substrate 8 is lower than the melting point of the solder 1 for mounting to the first mounted substrate 5. Moreover, since the reinforcing members 7 exist at all bonding parts 6 and the bonding is made to be performed while holding the space 16 between the bonding parts 6 adjoining each other, at the soldering portions where the first mounted substrate 5 and the second substrate 8 are bonded, the bonding strength is higher than that only with the solder of 42Sn-58Bi, and the stress by the expansion and contraction by the cyclic thermal loading of the reinforcing member 7 can also be reduced as compared with the case where the reinforcing member 7 as the underfill is made to fill the space between the first substrate 5 and the second substrate 8.

In the case of the mounted structure and the manufacturing method of the same of the present invention, after a semiconductor element 4 such as a BGA package of an electronic part or an LGA package, and an electronic part 2 such as a chip part are bonded by solder 1, when the sealed first mounted substrate 5 is mounted on the second substrate 8, the solder 1 of 96.5Sn-3Ag-0.5Cu for the first mounted substrate 5 does not melt and connection failure is not caused by realizing the mounting temperature that is lower than the melting point of the solder 1 of 96.5Sn-3Ag-0.5Cu for the first mounted substrate 5, and reinforcing the circumference of the bonding part 6 by the reinforcing member 7. Moreover, the mounted structure having the high reliability can be realized by reinforcing at least the circumference of the bonding part 6 which bonds the first mounted substrate 5 and the second substrate 8 and contains the solder of the low melting point.

The mounted structure and the manufacturing method of the same of the present invention can be utilized for mounting at the temperature that is comparatively lower than the melting point of the lead-free solder 1 of 96.5Sn-3Ag-0.5Cu, the mounting of a module substrate whose allowable heat-resistance temperature is comparatively low, the possibility of giving the heat damage is lowered to a minimum or is prevented substantially, and as a result a high-quality mounted structure can be realized.

Since the mounted structure and the manufacturing method of the same of the present invention can be utilized for mounting the module substrate to the mother substrate, they can be utilized for products containing this module, for example, BD related equipment, a cellular phone, portable AV equipment, a notebook PC, a digital camera, a memory card and the like.

INDUSTRIAL APPLICABILITY

A mounted structure and a manufacturing method of the same have, in the constitution in which the first mounted substrate to which semiconductor elements were bonded and mounted with solder has been mounted on the second substrate, an effect such that a dropping characteristic and a temperature cycling characteristic are good with reliability made to be higher than that of the conventional type, and are useful as products containing a module of the constitution in which the module substrate is mounted to the mother substrate, for example, BD related equipment, a cellular phone, portable AV equipment, a notebook PC, a digital camera, a memory card and the like, and a method for manufacturing the same.

DESCRIPTION OF SYMBOLS 1 solder
2 electronic part
3 sealing material
4 semiconductor element
5 first mounted substrate
6 bonding part
7 reinforcing member
8 second substrate
9 height of bonding part
10 height of reinforcing member
12 bump
13 compound material
14 plane electrode pad
15 electrode
16 space between bonding parts
17 reinforcing-member surface
21 solder 22 electronic part
23 sealing material
24 semiconductor element
25 first mounting substrate
26 bonding part
27 second substrate

What is claimed is:

1. A mounted structure, comprising:
a first mounted substrate that has a first side surface and a second side surface opposing the first surface;
a semiconductor element;
a first solder that bonds the semiconductor element with the second side surface, the first solder having a melting point of 217° C. or more;
a second substrate above which the first mounted substrate is mounted;
bonding parts that each bond the second substrate to the first side surface, the bonding parts each including a second solder having a melting point that is lower than the melting point of the first solder; and
reinforcing members that are each composed of materials including liquid bisphenol F type epoxy resin and imidazole system curing agent,
each of the reinforcing members surrounding and contacting a corresponding one of the bonding parts, contacting and spreading toward both the first mounted substrate and the second substrate, and being apart from the other reinforcing members.

2. The mounted structure according to claim 1, wherein when a volume between the first mounted substrate and the second substrate, is denoted as V0,
a sum total volume of each bonding part which is formed between the first mounted substrate and the second substrate, is denoted as V1, and
a sum total volume of each reinforcing member which is formed between the first mounted substrate and the second substrate, is denoted as V2, a following formula is established:

$$V0-V1-V2>0.$$

3. The mounted structure according to claim 1, wherein the reinforcing member is in contact with the second substrate,
a height of the reinforcing member formed around the bonding part is 1/5 or more of a distance between the substrates with reference to a surface of the second substrate.

4. The mounted structure according to claim 1, wherein the second solder contains at least Sn and has a melting point of 200° C. or less.

5. The mounted structure according to claim 4, wherein composition of the second solder contains either metal of Bi of 50 to 70 wt % or In of 10 to 25 wt %, and residue is Sn.

6. The mounted structure according to claim 1, wherein the first mounted substrate is thinner than the second substrate.

7. The mounted structure according to claim 1, wherein the first mounted substrate is a BGA type in which bumps are formed on a surface of the first mounted substrate, that faces the second substrate, by using solder balls.

8. The mounted structure according to claim 1, wherein the first mounted substrate is an LGA type in which plane electrode pads are formed on a surface of the first mounted substrate, that faces the second substrate.

9. The mounted structure according to claim 1, wherein each of the reinforcing members continuously surrounds the corresponding one of the bonding parts.

10. A manufacturing method of a mounted structure, the method comprising:
bonding a semiconductor element to a first mounted substrate with a first solder interposed therebetween, the first solder having a melting point of 217° C. or more, the first mounted substrate having a first side surface and a second side surface opposing the first side surface;
supplying a compound material on a plurality of places on a second substrate,
the compound material containing liquid bisphenol F type epoxy resin, imidazole system curing agent, and a second solder having a melting point that is lower than the melting point of the first solder;
disposing the first mounted substrate above the second substrate such that the first mounted substrate comes into contact with the compound material;
heating the compound material at a temperature to form bonding parts and reinforcing members such that the second substrate is bonded to the first side surface with the bonding parts, and that the reinforcing members each surround and contact a corresponding one of the bonding parts, contact and spread toward both the first mounted substrate and the second substrate, and are apart from the other reinforcing members, the temperature being lower than a melting point of the first solder and higher than a melting point of the second solder.

11. The manufacturing method of the mounted structure according to claim 10, wherein
the first mounted substrate is a BGA type in which bumps have been formed on a surface of the first mounted substrate, that faces the second substrate, by using solder balls,
in the case of bonding the first mounted substrate and the second substrate, and
the bonding parts are formed by the bump and the second solder, and are formed on a plurality of places.

12. The manufacturing method of the mounted structure according to claim 10, wherein
the first mounted substrate is an LGA type in which plane electrode pads have been formed on a surface of the first mounted substrate, that faces the second substrate,
in the case of bonding the first mounted substrate and the second substrate,
bonding parts bonding the first mounted substrate and the second substrate, which are formed by the second solder, are formed on a plurality of places, and
a reinforcing member, which reinforces the bonding part, is formed in contact with the first mounted substrate and the second substrate, by the reinforcing resin gathering around the bonding part.

13. The manufacturing method of the mounted structure according to claim 10, wherein the reinforcing members are formed such that each of the reinforcing members continuously surrounds the corresponding one of the bonding parts.

* * * * *